(12) United States Patent
Papanikolaou et al.

(10) Patent No.: US 11,221,452 B2
(45) Date of Patent: Jan. 11, 2022

(54) COMMUNICATION RECEIVER

(71) Applicant: MACOM Technology Solutions Holdings, Inc., Lowell, MA (US)

(72) Inventors: Vasilis Papanikolaou, Toronto (CA); Marek Tlalka, San Marcos, CA (US); Atul Gupta, Aliso Viejo, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 24 days.

(21) Appl. No.: 16/699,490

(22) Filed: Nov. 29, 2019

(65) Prior Publication Data

US 2020/0096711 A1    Mar. 26, 2020

Related U.S. Application Data

(63) Continuation of application No. 15/679,078, filed on Aug. 16, 2017, now Pat. No. 10,495,831.

(60) Provisional application No. 62/380,226, filed on Aug. 26, 2016.

(51) Int. Cl.
*G02B 6/42* (2006.01)
*H03F 3/08* (2006.01)
*G02B 6/12* (2006.01)

(52) U.S. Cl.
CPC .......... *G02B 6/425* (2013.01); *G02B 6/4201* (2013.01); *H03F 3/087* (2013.01); *G02B 2006/12111* (2013.01); *G02B 2006/12123* (2013.01); *G02B 2006/12138* (2013.01)

(58) Field of Classification Search
CPC .............. G02B 6/425; G02B 6/4201; G02B 2006/12123; G02B 2006/12111; G02B 2006/12138; H03F 3/087
See application file for complete search history.

(56) References Cited

U.S. PATENT DOCUMENTS

| 6,754,407 | B2 * | 6/2004 | Chakravorty | G02B 6/43 385/14 |
| 8,231,284 | B2 * | 7/2012 | Doany | G02B 6/43 385/92 |
| 9,064,981 | B2 | 6/2015 | Laforce | |
| 10,495,831 | B2 * | 12/2019 | Gupta | G02B 6/425 |
| 2006/0034621 | A1 | 2/2006 | Denoyer | |

* cited by examiner

*Primary Examiner* — Tony Ko
(74) *Attorney, Agent, or Firm* — Weide & Miller, Ltd.

(57) ABSTRACT

A transimpedance amplifier and photodiode that has a bias voltage node established at a bias voltage and a ground node/plane that connects, over a short distance as compared to the prior art, to a photodiode and a transimpedance amplifier. The photodiode is in a substrate and configured to receive and convert an optical signal to an electrical current. The photodiode has an anode terminal and a cathode terminal which is connected to the bias voltage node. One or more capacitors in or on the substrate and connected between the bias node and the ground node. The transimpedance amplifier has an input connected to the anode terminal of the photodiode and an output that presents a voltage representing the optical signal to an output path. The transimpedance amplifier and the photodiode are both electrically connected in a flip chip configuration and the ground plane creates a coplanar waveguide.

18 Claims, 7 Drawing Sheets

COMMUNICATION RECEIVER

1. PRIORITY CLAIM

This application is a continuation of, claims priority to and the benefit of U.S. patent application Ser. No. 15/679,078 filed on Aug. 16, 2017, which claims priority to and the benefit of U.S. Provisional Patent Application 62/380,226 filed on Aug. 26, 2016 and entitled PAM4 Receiver.

2. FIELD OF THE INVENTION

This invention relates to photodetectors and transimpedance amplifiers and in particular to a photodetector and transimpedance amplifier located in a single package and having co-planar waveguides associated with the photodetector and the transimpedance amplifier output.

3. RELATED ART

This innovation relates to photodiodes and transimpedance amplifiers (TIA). In optical communication systems, the data is often transmitted between different locations using an optic signal. At receiving stations, the optical signal is converted to an electrical signal using a photodiode and transimpedance amplifier (TIA). The photodiode is an electronic device that converts an optical signal to an electrical signal. The TIA is a device or circuit that converts low level current signal to voltages. Because the output of the photodiode is low current magnitude signal, its output is susceptible to noise and any other unwanted signal changes that may be introduced by the photodiode or TIA.

When configured as part of a circuit, the optic signal is presented to the photodiode from the fiber optic cable. The photodiode generates an electrical signal that is presented to the TIA through one or more electrical conductive paths. In the TIA, additional processing and amplification occurs to convert the signal to a format and power level that is suited for additional downstream processing.

Prior art circuit designs with photodiodes and TIA utilized wire bonds to connect the electrical output of the photodiode to the TIA. Wire bonds, typically extend from the TIA to the package, substrate, or another element. In this manner and in some embodiments, the wire bonds connect the TIA to the package. The package would typically have conductive metal pins that extend from the side of the package for electrical connection to a circuit board, or use solder balls.

In some embodiments, wire bonds also connect the photodiode to the TIA, within the package. In the prior art, the photodiode and TIA were located on separate integrated circuit dies located in different packages. While use of wire bonds for inter-device connection was acceptable in prior art designs, particularly when used for low frequency applications, the wire bond arrangement suffers from several drawbacks when used in high frequency applications.

One such drawback is that the wire bond connections and location of the TIA in relation to the photodiode establishes inductance. While this inductance provided certain benefits at low frequency operation, the inventors realized that at higher frequencies, the wire bond introduces inductance which was limiting operation at higher data rates. The inductance caused by the wire-bond connections and relative locations of the photodiode and TIA causes overshoot, ringing and loss of energy at high frequency, which in turn limits bandwidth.

In addition, prior art circuit designs suffered from issues with long ground paths, floating grounds, or non-uniform ground between the photodiode and the TIA. This can lead to less than optimal circuit performance. The innovation disclosed below overcomes these drawbacks and provides additional benefits.

SUMMARY

To overcome the drawbacks of the prior art and provide additional advantages, disclosed is a transimpedance amplifier and photodiode. In one embodiment, this system includes a bias voltage node established at a bias voltage and a ground plane. A photodiode, integrated on a substrate, is configured to receive an optical signal and generate an electrical current representing the optical signal, the photodiode having a cathode terminal and an anode terminal with the cathode terminal connected to the bias voltage node. A capacitor, integrated in the photodiode, such that the capacitor has a first capacitor terminal and a second capacitor terminal. The first capacitor terminal connects to the bias voltage node and the second capacitor terminal connects to the ground plane. Also part of this embodiment is a transimpedance amplifier which has an input and an output. The input connects to the anode terminal of the photodiode by a transmission line interconnect, and the output configured to present a voltage representing the optical signal to an output path. The transimpedance amplifier and the photodiode are both electrically connected in a flip chip configuration such that the flip chip configuration does not use bond wires, and the ground plane surrounding the transmission line interconnect between the photodiode and the transimpedance amplifier create a coplanar waveguide.

In one embodiment, this system further includes a second capacitor which is not integrated in the photodiode such that the second capacitor is connected between the bias voltage node and the ground plane. In one configuration, the transimpedance amplifier output path includes a conductive trace that has a first edge and second edge, and the opposing first edge and the second edge is the ground plane thereby forming a coplanar waveguide. It is contemplated that the ground plane may be parallel to the first edge of the conductive trace and the ground plane is parallel to the second edge of the conductive trace. In one embodiment, the transimpedance amplifier and photodiode are configured to process a pulse amplitude signal with four amplitude levels. The transimpedance amplifier may include an amplifier that has an active gain component, such as an NPN or NMOS whose emitter in case of NPN or source in case of NMOS is connected to the ground node.

Also disclosed herein is a transimpedance amplifier and photodiode on a semiconductor die that includes a photodetector configured to receive an optical signal and generate an electrical current representing the optical signal. The photodiode has a cathode terminal and an anode terminal and the terminal, the ground terminal is connected to a ground node. The first capacitor terminal connects to the bias voltage node and the second capacitor terminal connects to the ground node. The transimpedance amplifier has an input and an output. The input connected to the anode terminal of the photodiode by a transmission line interconnect and the output configured to present a voltage representing the optical signal to an output path. The transimpedance amplifier connects to the ground node, such that the transimpedance amplifier and the photodiode are both electrically connected in a flip chip configuration. The flip chip configuration is enabled without bond wires, and such that the ground node provides a common ground node for the photodetector, capacitor and transimpedance amplifier.

In one embodiment, the ground node extends to each side of and between two output paths from the transimpedance amplifier to create a coplanar waveguide. In one embodiment, the ground node extends to each side of and between the photodetector cathode terminal and the anode terminal to create a coplanar waveguide. The transimpedance amplifier and photodiode may further include a second capacitor which is not integrated on the substrate with the second capacitor connected between the bias voltage node and the ground plane. In one configuration, the transimpedance amplifier and photodiode further comprising a bias voltage node established at a bias voltage with the cathode terminal connected to the bias voltage node. It is contemplated that the ground connection between the semiconductor die, and a package, and a circuit board occurs through one or more solder bumps thereby shortening the length of the ground connection.

Also disclosed is a method for converting an optical signal to an electrical using a photodetector and transimpedance amplifier. In one disclosed embodiment, the method includes receiving an optical signal at a photodetector and then converting the optical signal to an electrical signal with the photodetector. The photodetector is located on a semiconductor die and having a cathode terminal and an anode terminal such that the anode terminal connects to a ground node. This method also includes presenting the electrical signal to a transimpedance amplifier. The transimpedance amplifier has an input and an output such that the input is connected to the anode terminal of the photodiode and the output presents a voltage representing the optical signal to an output path. The transimpedance amplifier also connects to the ground node and the transimpedance amplifier and the photodiode are both electrically connected in a flip chip configuration. As part of this configuration, the method creates a co-planar wave guide with a portion of a ground node that extends between and on both sides of the output path of the transimpedance amplifier and around one or more of the photodiode leads.

It is also contemplated that a capacitor is integrated on the substrate, with the capacitor having a first capacitor terminal that is connected to the bias voltage node and the second capacitor terminal connected to the ground node. In one embodiment, the photodetector and transimpedance amplifier are both on the same semiconductor die. This method may further comprise electrically connecting the photodetector and transimpedance amplifier to a package through one or more solder balls associated with the flip chip configuration. In addition, the ground node may be extended to each side of and between the photodetector cathode terminal and the anode terminal to create a coplanar waveguide. In one configuration, the optic signal is a pulse amplitude modulated signal with four amplitude levels.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
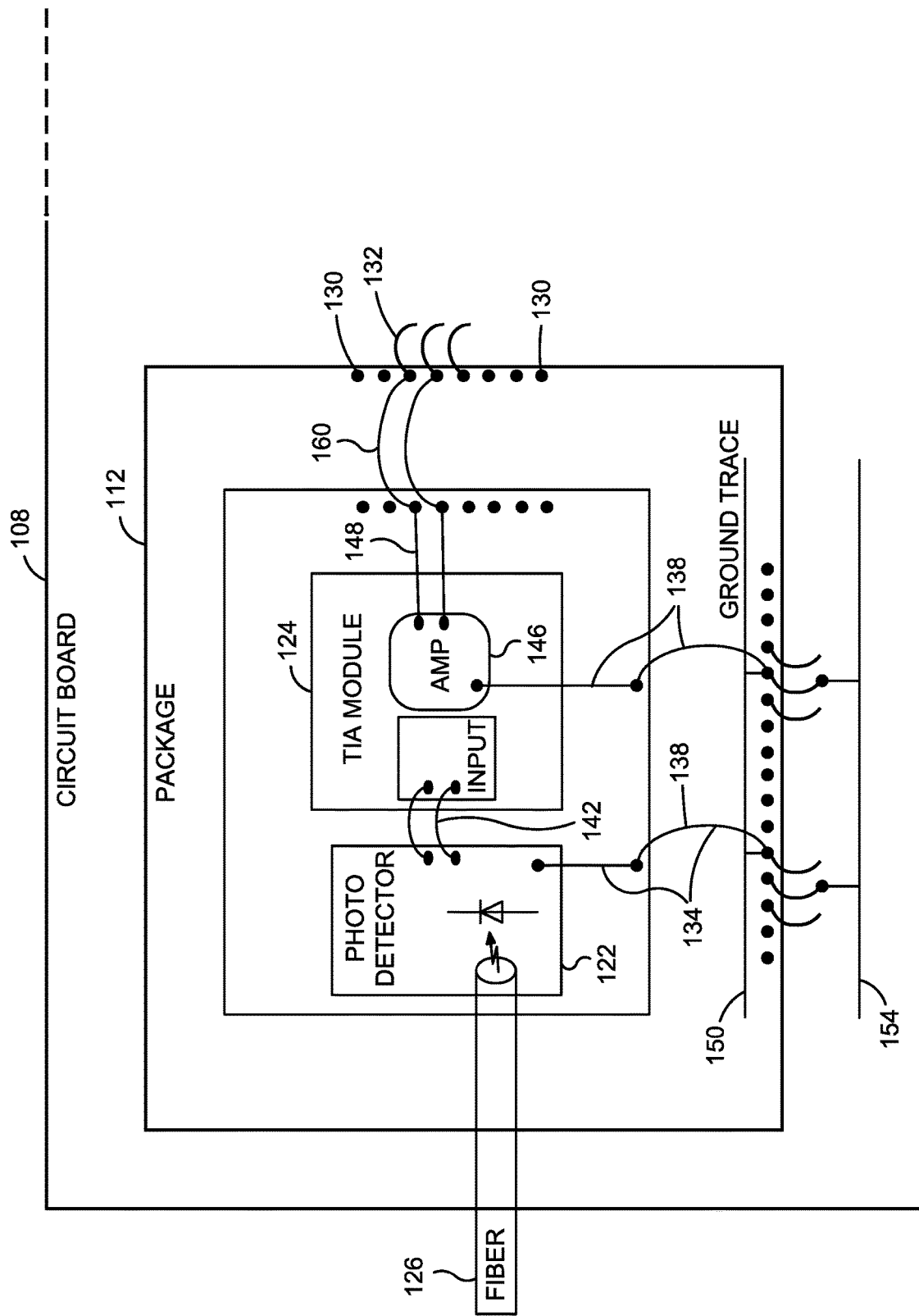
FIG. 1 illustrates a traditional photodiode and TIA arrangement.

FIG. 1 illustrates a traditional photodiode and transimpedance amplifier arrangement. In this configuration, a circuit board or other substrate provides a support surface of the one or more electrical components. The circuit board includes one or more insulating layers and one or more conductive layers or conductive traces. The conductive layers or conductive traces are configured to conduct electrical signals. Located on the circuit board 108 are one or more packages 112. The package 112 contains a substrate insulating and conductive elements. Around the outer edge of this traditional package 112 are pins that conduct electrical signal to and from the package to the circuit board 108.

Located on the interior of the package 112 is a photodetector 122. A fiber optic cable 126 has an end located proximate to a photodetector 122 such that an optic signal emitted from the end of the fiber optic cable 126 is received by the photodetector 122. The photodetector generates an electrical signal representing the optical signal, which is conducted over wire bonds 142 to a TIA module 124. The TIA module 124 includes an input and an amplifier 146. The output of the TIA amplifier 146 is presented on conductive traces 148 to the edge or to the package conductor. The TIA output signal is conducted by wire bonds 160 to an edge of the package 112. Package pins 132 present the electrical signal on the outside of the package 112.

To establish a ground for the electrical components, a ground path 134 is provided for the photodiode 122 to a package ground trace 150. A ground path 138 is provided for the TIA 124 to the package ground trace 150. In turn, the package ground trace 150 connects to a circuit board ground plane 154. This long signal path using bond wires introduces unwanted inductance into the signal path leading to variation in gain at different frequencies which distorts the signal.

As can be seen in FIG. 1, a distance between the photodetector 112 along wire bond 142 to the TIA amplifier 146 is significant. In addition, the distance the output signal of the amplifier 146 must travel defined as the distance between the output of the TIA amplifier 146 along path 148, 160 to the pins 132. Likewise, the ground path for the photodetector ground to the circuit board ground 154 along path 134. This long ground path leads to further variation in gain at different frequencies causing further distortion to the signal.

To overcome the drawbacks of the prior art and provide additional benefits, an optical receiver is disclosed for receiving an optical signal and converting the optical signal to an electrical signal.

Figure 2:
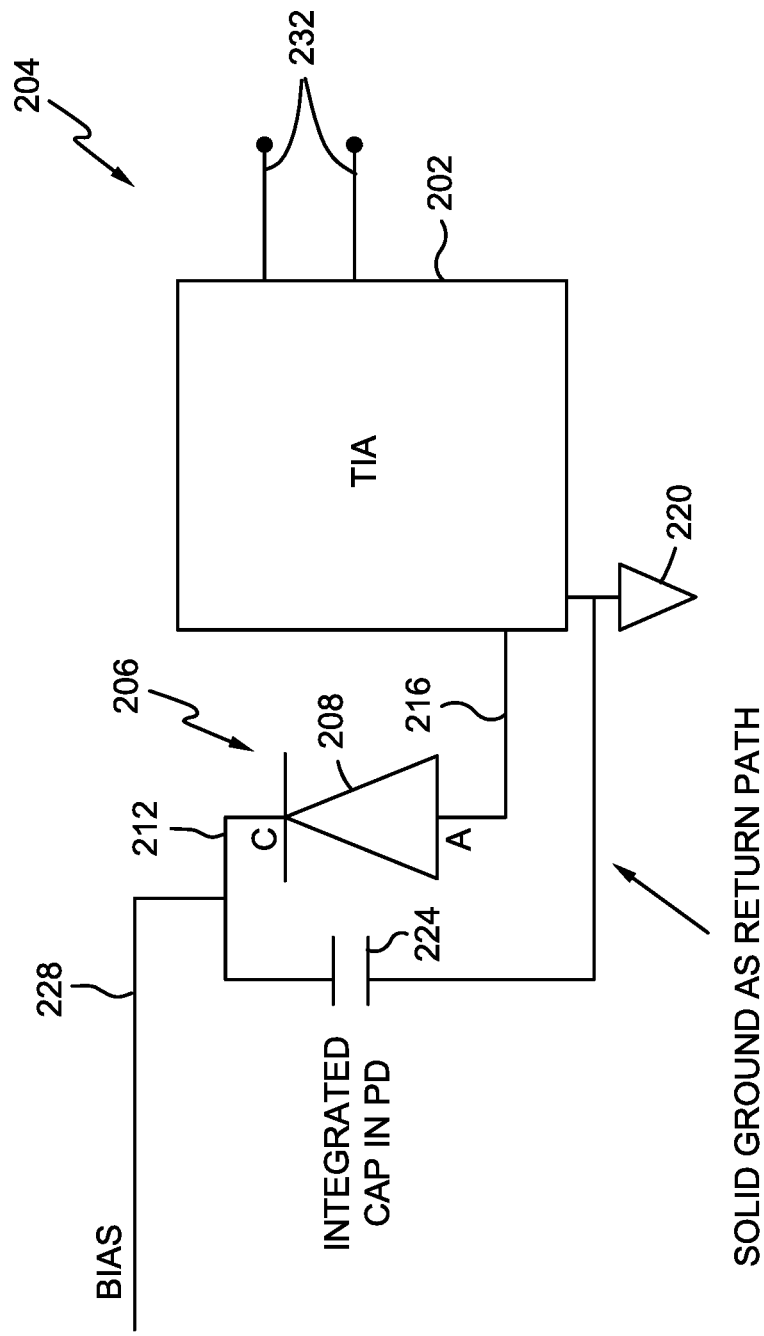
FIG. 2 is a block diagram illustrating an exemplary photodiode and transimpedance amplifier circuit.

FIG. 2 is a block diagram illustrating an exemplary photodiode and transimpedance amplifier circuit. The receiver system 204 includes a transimpedance amplifier (TIA) 202 configured to receive an input signal from a photodiode 208 and present and output signal (either single ended for differential), an output 232. The photodiode 208 detects an optical signal 206, such as from a fiber optic cable, and converts the optic signal to an electrical signal. The TIA 202 amplifies the photodiode 208 output for further processing. The photodiode may be a monitor diode to monitor transmit power or configured to receive an optic data communication signal from a remote location.

The photodiode 208 is biased by a bias signal on bias node 228. Arranged in association with the photodiode circuit is a capacitor 224, which may be integrated with the photodiode 208. The capacitor should be considered as an option, or only provided in certain embodiments. In some embodiments, the capacitor is beneficial because if it were not present certain circuit parameters may become out of specification. For example, if the system is designed with the bias voltage connected to the TIA 202, in some cases the bias voltage may be too high for the TIA, and the capacitor 224 will reduce the voltage presented to the TIA by only passing the high-speed signal to the TIA while blocking the DC current.

The TIA 202 and the capacitor 224 (as part of the photodiode 208) connect to a ground node. Of importance, the photodiode 208 is arranged such that the cathode terminal 212 connects to the bias node 228 for biasing while the anode terminal 216 connects to the TIA.

Of benefit over the prior art, the TIA 202, the photodiode 208, or both, are arranged as a flip chip configuration such that the TIA 202, the photodiode 208, or both are configured with an array of solder bumps and electrically bonded directly to a substrate. The use of bond wires is avoided.

Figure 3:
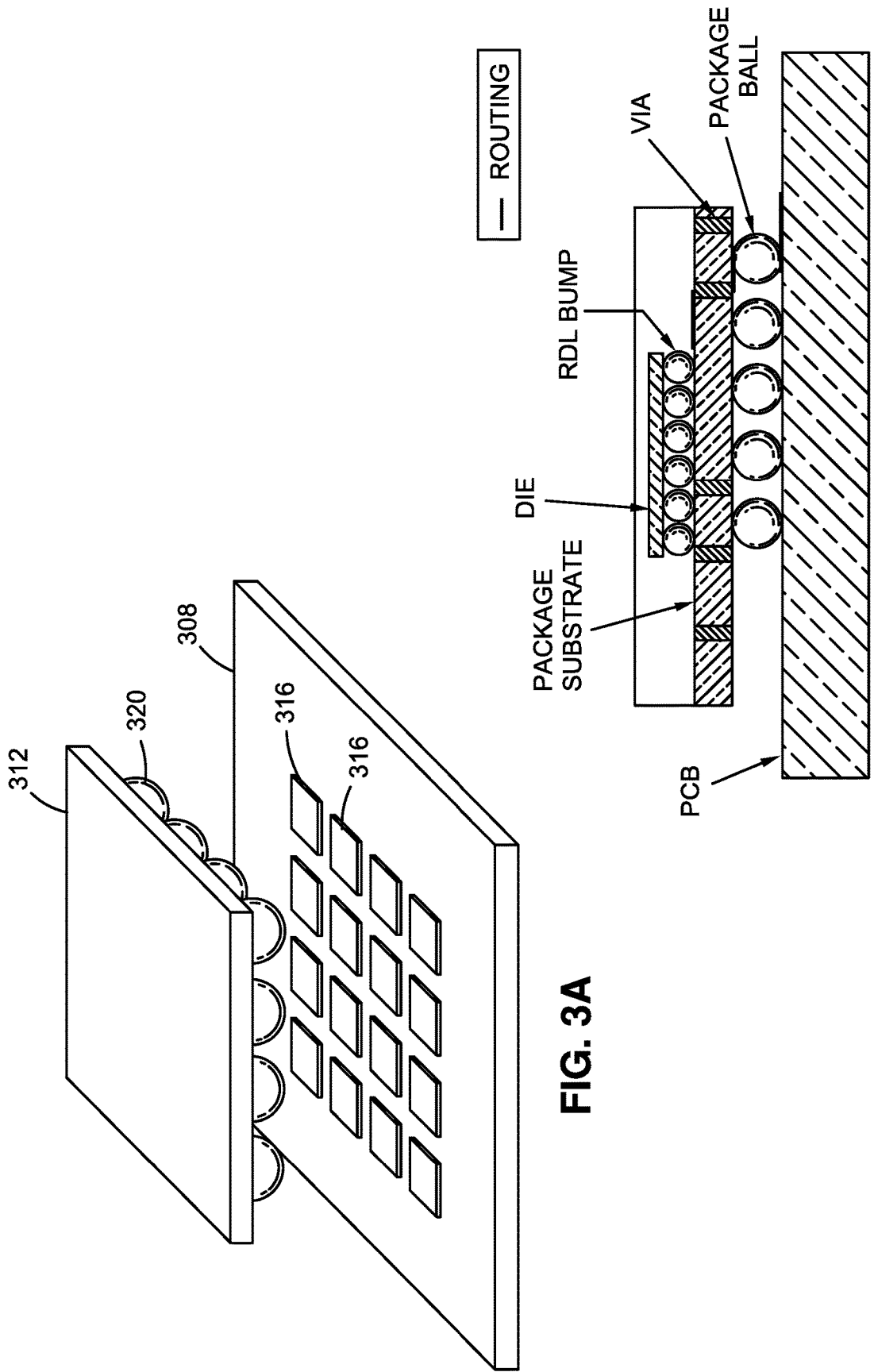
FIG. 3A is a perspective view of a flip-chip arrangement.
FIG. 3B is an alternative view of a flip-chip arrangement on a substrate with printed traces and vias.

FIG. 3 illustrates a perspective view of a flip chip configuration. This is but one possible configuration and method for connecting an integrated circuit to a package or a package to a circuit board.

Shown in FIG. 3 is a package base 308 which includes one or more bond pads 316. The bond pads are conductive pads that electrically connect to the package's electrical layers or traces (not shown). A semi-conductor integrated circuit die 312 containing one or more integrated circuit is located above the package base 308. On the surface of the die 312 that faces the package 308, are one or more solder balls 320 that physically align with the bond pads 316 on the package. During assembly, the solder balls 320 are physically and electrically connected to the bond pads 316 to create an electrical connection. This arrangement aligns the die with the package to provide electrical connections at any location on the lower surface of the die.

In environments operating with PAM (pulse amplitude modulation), such as PAM 4, the reduction of inductances is of greater importance. PAM4 utilizes 4 levels which in turn makes the eye diagram tighter and effects of ringing or drop off is less tolerable. Thus, there is a need for good signal integrity for PAM4. It, in essence, doubles the bit rate so a 50 Gbaud rate is really 100 Gbit/second pay-load.

Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal.

To attach the flip chip into a circuit, the chip is inverted to bring the solder dots down onto connectors on the underlying electronics, substrate or circuit board. The solder is then re-melted to produce an electrical connection, typically using a thermosonic bonding or alternatively reflow solder process or any other method. Advantages of flip chip configuration include assemblies which are smaller than a traditional carrier-based system; the chip sits directly on the substrate and is much smaller than the carrier both in area and height. The bonding method greatly reduces inductance, as compared to wire bond connections allowing higher-speed signals, and increase heat conduction.

Figure 4:
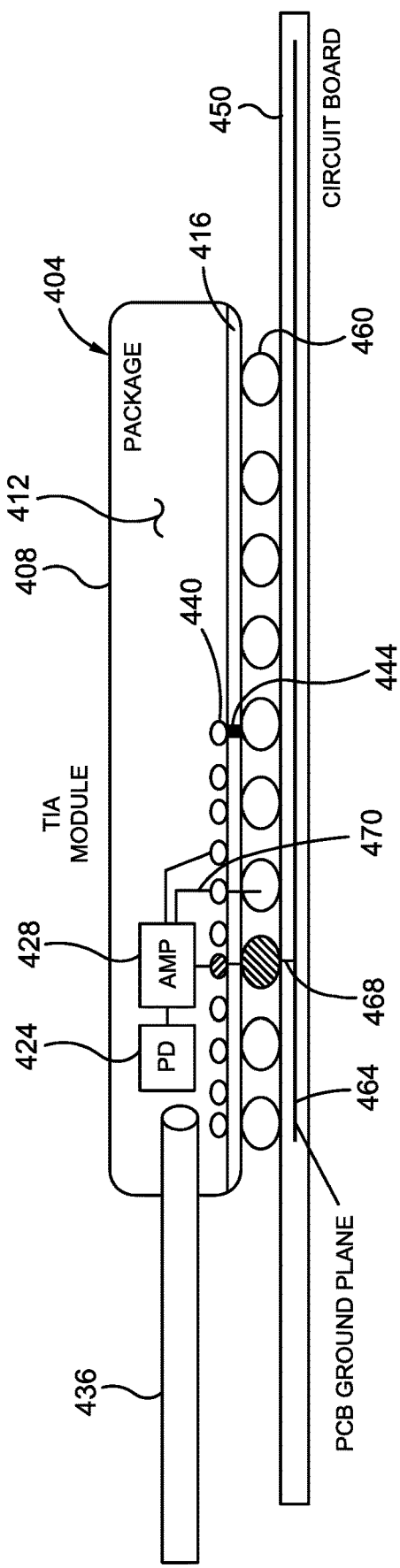
FIG. 4 illustrates the die to package arrangement and aid in understanding of the benefits of this arrangement.

Configuring the TIA, photodiode, or both as a flip chip configuration lowers the inductance and thereby improves performance at high frequency. FIG. 4 illustrates the die to package arrangement and aid in understanding of the benefits of this arrangement.

In FIG. 4, a package 404 is shown that includes an outer shell or housing 408 and an inner area 412. On the interior of the package 404 is a substrate 420 that may comprise semiconductor devices that contain one or more circuit and electrical components. In this example embodiment, a photodetector 424 and a TIA 428 are inside the package and connect to the package through solder balls or bumps as shown. The photodetector is positioned in relation to an optic signal source, such as a fiber optic cable 436. In other embodiments, other mediums or elements may be used to provide or conduct the optic signal to the photodetector 424. In one embodiment, the photodetector 424 is a photo monitor diode. The photodetector 424 is electrically connected to the TIA 428 and, in particular to an amplifier element of the TIA.

The photodetector 424 and TIA 428 electrically connect to the package 404 through one or more solder dots or solder balls 440 in a flip chip arrangement. The package includes interconnects, which are electrical conductors on or in the package which are not bond wires. On the package 404, there are electrically conductive bond pads 444 located on a package base 416. A ground plane may be located in or on the package base. The bond pads 444 align with and electrically connect to the solder balls 440 thereby connecting the photodetector 424 and TIA 428 to one or more traces or conductive paths or layers in the package 404.

In turn, the package 404 electrically connects to a circuit board 450 through solder balls 460. In the circuit board 450 is a ground trace or ground plane 464 and other conductive traces configured to carry one or more electrical signals. The ground signal from the photodetector 424 and the TIA 428 connects to the ground plane through via 468 or other conductive paths. Likewise, the signal path connects to the circuit board through signal path 470 and a solder ball 460.

Comparing the arrangement of FIG. 1 to the arrangement of FIG. 4, the ground path 468 and signal path 470 for the arrangement of FIG. 4 is significantly shorter than in the arrangement of FIG. 1. In FIG. 4, the path is directly downward from the die 420, to the package 404, and to the circuit board 450 through thick and separated conductive paths, such as vias and solder balls. In contrast, the signal and ground paths in the arrangement of FIG. 1 are longer and utilized bond wire interconnects. This introduces unwanted inductance and reduces system performance.

In addition, the arrangement of FIG. 4 places both the photodetector 424 and the TIA 428 on a shared or the same substrate. This increases proximity of these devices and eliminates the need for bond wire interconnects. Placing both the photodetector 424 and the TIA 428 on the same die also allows both elements to share a common direct ground node thereby eliminating some of the drawbacks found in the prior art.

Also disclosed herein is a new photodiode arrangement. Returning to FIG. 2, the photodiode 208 has two terminals;

and anode and cathode as identified above. In this arrangement, the photodiode 208 is arranged upside down or reverse connected. The anode is at the lower potential while the cathode is at a higher potential. This feature further improves high frequency operation as described below.

Yet another feature is the capacitor 224 which is connected to the TIA 202 and the ground node 220. The capacitor 224 is inside photodiode 208 but in other embodiments the capacitor 224 may be an external component. The TIA ground and photodiode ground are not a floating or distant ground, but a true and close ground. The ground is a true and close ground because the anode terminal 216 is connected to the TIA 202, both of which are tied to ground and the ground is directly connected through a flip chip connection to the substrate and then through a printed trace on the substrate to the photodiode. Hence, the ground is not floating and due to the short distance (avoiding use of bond wires) no additional inductance is created (inductance is minimized) in the ground path. The substrate may be any type of substrate such as glass, quarts, PCB, package material, or any other material or structure. The conductors on or in the substrate that connect the photodiode to the TIA and establish a ground path may be printed traces.

While biasing is still needed, it is at the cathode terminal 212 which is biased. The combination of the flip chip design and the reverse attachment configuration of the photodiode 208 with a true common ground results in unique design elements individually and in combination.

The reversed terminals (anode, cathode) connection of the photodiode and the common true ground of photodiode and TIA also provides advantages over the prior art. In the TIA there is amplifier transistor which has ground and this amplifier ground is a sensitive node for high frequency performance. Inductance in the amplifier transistor ground path creates a ripple in TIA performance, such as notch or other type of unwanted anomaly. This is one area where excess inductance will prevent high frequency operation.

The second area that is sensitive to inductance is the signal path from TIA to TIA—second place is the ground inductance of the amplifier. In the past, the integrated circuit die with bond wires were facing up the ground not well defined due to long bond wires connects to substrate. But when flip chip configuration is used, the ground is very well defined because short and direct trace and ground path. With this configuration, the ground is very well defined and connected through and with many solder bumps at one or more locations including the center of the chip or at close location to TIA amplifier transistor, which in turn provides a low inductance introducing ground. In contrast, in the prior art the ground path includes a path of bond wires connected around the outer edge of the chip (TIA die) and caused the ground to not be well defined and to float and introduce inductance. This proposed configuration can flood the TIA and photodiode chip with a stable and short ground right in the center of each chip or at any ideal location to establish a perfect connection without a long bond wire. A very short and direct connection from the TIA amplifier (within the TIA) to substrate ground makes the ground very well defined, stable, and of low inductance.

Figure 5:
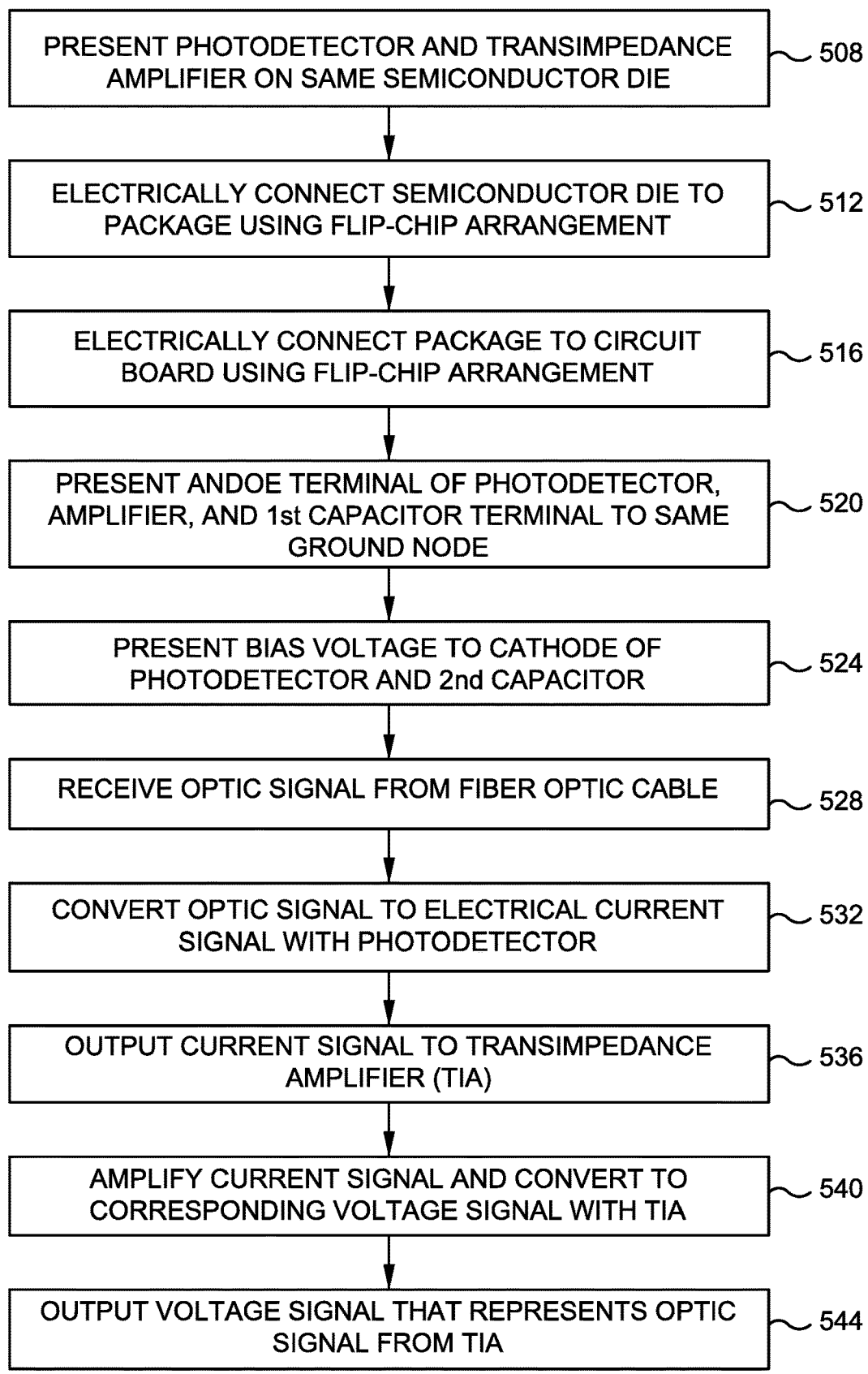
FIG. 5 illustrates an operational flow diagram of an exemplary method of operation and device arrangement.

FIG. 5 illustrates an operational flow diagram of an exemplary method of operation and device arrangement. This is but one possible example embodiment and other embodiments are methods are contemplated.

In this exemplary embodiment at a step 508, a photodetector and transimpedance amplifier are presented on the same semiconductor die. Placing both elements on the same die reduces the distance that the signal generated by the photodetector must travel to reach the TIA and also allows both elements to share a common ground node, with each respective path to ground being very short as compared to the prior art.

At a step 512, such as during manufacturing or assembly, this method electrically connects the semiconductor die to package using flip-chip arrangement. This places numerous solder balls covering a lower surface of the die in contact with the package. As discussed above, this reduces the distance between components of the die with the package, including a die ground node to a package ground.

At a step 516, the method electrically connects the package to a circuit board using flip-chip arrangement. As discussed above, this established short signal paths and ground paths from the package to the circuit board. Then, at a step 520 the anode terminal of the photodetector, the amplifier, and the first capacitor terminal connect to the same ground node through the solder balls, vias or a combination of both to create a shorter signal path than if bond wires were utilized.

At a step 524 this method of operation presents a bias voltage to the cathode of the photodetector and the second capacitor terminal. With the photodetector biased in this manner, the photo diode converts optical light into electrical current. At a step 528, the photodetector receives an optic signal from a fiber optic cable. Next, at a step 532, the photodetector converts the optic signal to an electrical current.

Next, at a step 536, the system outputs a current signal that represents the optic signal to the transimpedance amplifier (TIA) for processing by the TIA. At a step 540, the system amplifies the electric current signal and converts the resulting signal to a corresponding voltage signal with TIA. Then, at a step 544 the system outputs the voltage signal that represents the optic signal from the TIA.

Figure 6:
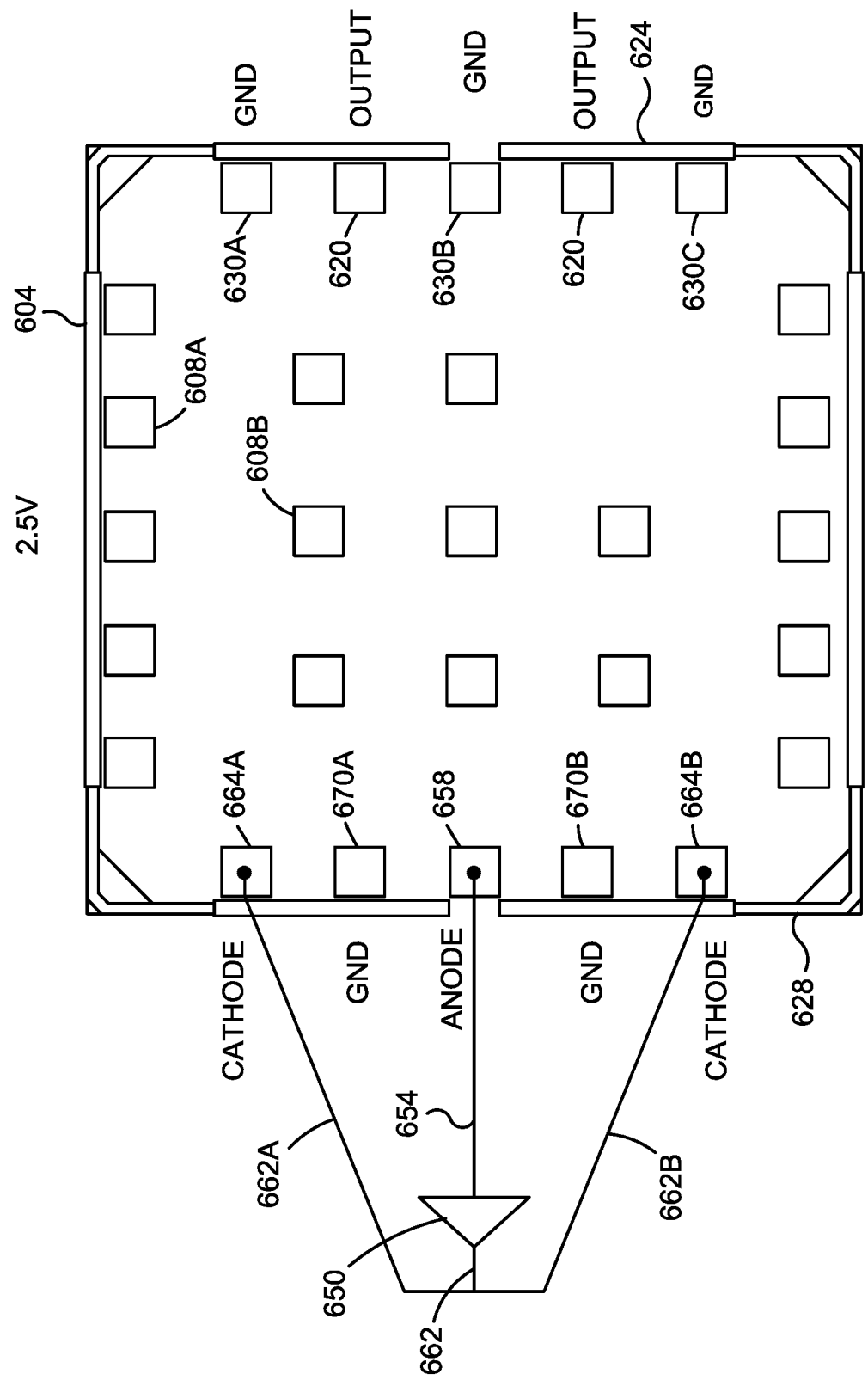
FIG. 6 illustrates a block diagram of an exemplary semiconductor die layout.

FIG. 6 illustrates a block diagram of an exemplary semiconductor (TIA) die layout. This is but one possible embodiment. The die 604 includes numerous signal input/output pas 608 located on the surface of the die. As discussed above, the die is configured for use in a flip chip configuration, or other similar configuration, thereby avoiding the use of bond wires.

In this example embodiment, the die includes output pads 620. In this embodiment, there are two output pads 620 located along one side 624 of the die 604. Located between the output pads 620, and also above and below the output pads are ground pads 630A, 630B, 630C. In one embodiment, these ground pads 630 electrically connect to ground paths or ground planes (not shown in FIG. 6) that extend in parallel to the conductive signal path that connects to the output pads 620. In one embodiment, this establishes a coplanar wave guide to the digital signal processing chip or connector of receive optical sub assembly. This is further described below in connection with FIG. 7.

Also shown in FIG. 6 is a photodiode that has an anode terminal 654 and a cathode terminal 662. The anode terminals 654 connects to an anode pad 658 while the cathode terminal 662 branches off into two conductive paths 662A and 662B as shown to connect to cathode pads 664A, 664B on the die 604. These pads are on a second side 628 of the die 604.

Between the cathode pad 664A and the anode pad 658 are ground pads 670A and 670B. In one embodiment, these ground pads 6670 electrically connect to ground paths or ground planes (not shown in FIG. 6) that extend in parallel or some uniform structure to the conductive signal path that connects to the output pads 620. In one embodiment, this establishes a coplanar wave guide with the photodiode on one side and a digital signal processing element on other side. This is further described below in connection with FIG. 7.

The interior pads 608B are aligned across the face of the die and one or more of these pads may be connected to the ground node or grand plane of another element, such as a package or a circuit board. By having the ground pad 608B centrally located on the die, the TIA amplifier may be located directly above this ground pad 608B, thus establishing a very short distance between the amplifier ground and the ground node or ground plane. This avoids the use of the long distances between the amplifier ground and the ground node/plane that occurs with the use of prior art bond wires extending from an edge of the die to a package.

Figure 7:
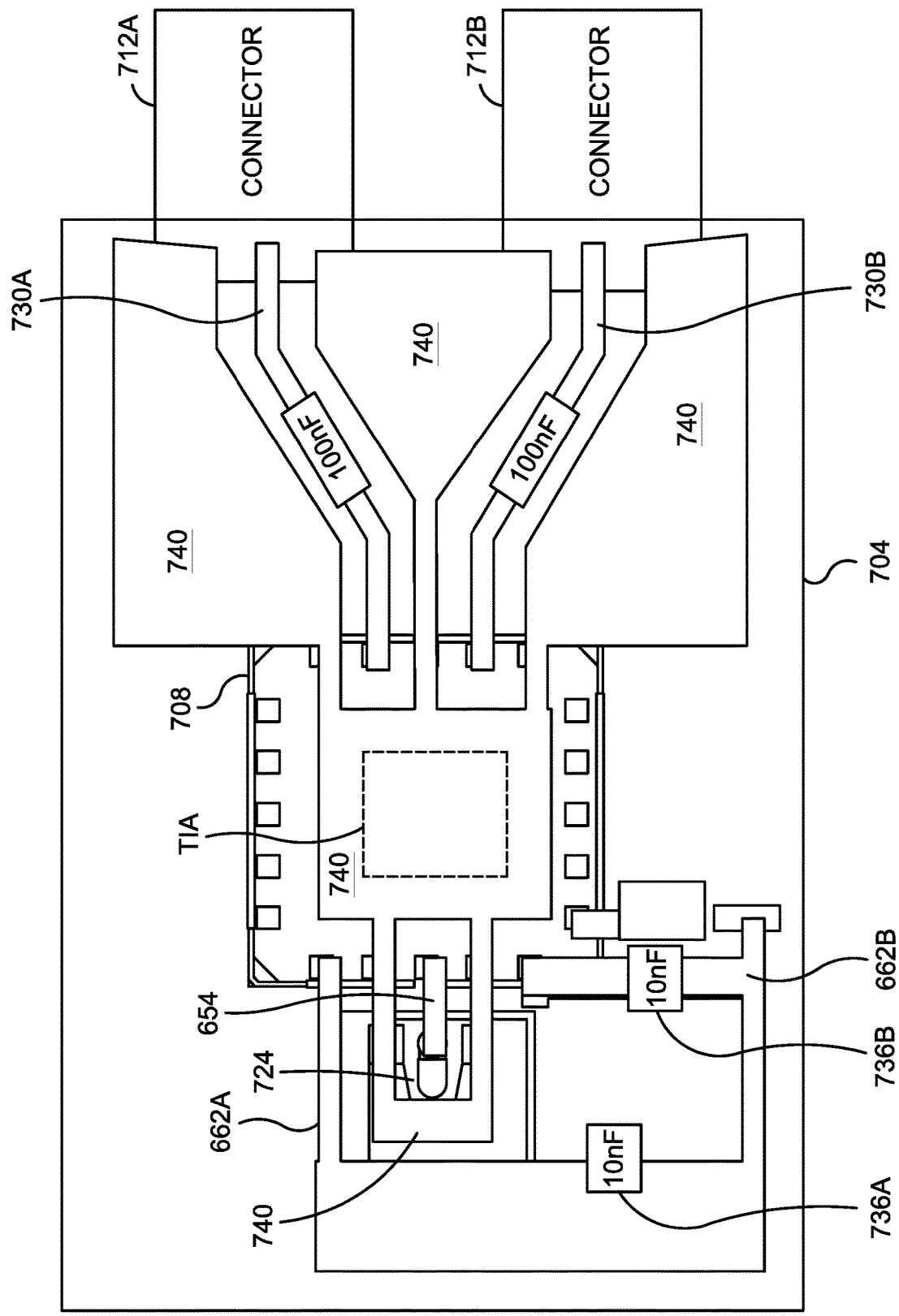
FIG. 7 illustrates a top view of a die with package elements and ground node/plane imposed thereon.

FIG. 7 illustrates a top view of a die with package elements and ground node/plane imposed thereon. This is but one possible embodiment and physical layout and other layouts and arrangements are possible without departing from the scope of the claims that follow. Shown in FIG. 7 is a package edge 704 shown in cut away view to expose one or more elements of the interior of the package and substrate. Within or on the package is a substrate 708. Electrical connectors 712A, 712B are located on the side of the package and are configured to provide an electrical signal from a TIA (not shown) on the package. Output conductive traces 730A, 730B electrically connect the substrate 708 to the connectors 712A, 712B. One or more capacitors may be part of or added to the output conductive traces 730A, 730B.

In the interior of the package 704 is a TIA 720. The TIA 720 may be located above or below the ground plane 740 that extends beyond the TIA. A photodetector 724 is located to the side of the package 704 to the side of the substrate 708. The cathode terminals 662A, 662B are shown extending from the photodetector 724 to the die as is the anode terminal 654. One or more capacitors 736A, 736B are also shown, one or more of which may be on or in the substrate 708 or with the photodetector 724.

In this embodiment, the ground node/plane 740 extends in several directions to create broad ground plane that is not only in close proximity to the TIA 720, and also extending to the area between the cathode terminals 662 and the anode terminal 654. Likewise, the common ground node/plane 740 extends to one or more areas between the output conductive traces 730A, 730B in a manner as shown which establishes a waveguide and thereby the transition is elegant between the chip and the waveguide or transmission line without poorly behaved bondwire. In one configuration, the distance between each of the output conductive traces 730A, 730B and the ground node/plane 740 is consistent, such that the edge of each element is generally parallel. For co-planer waveguide, the edge separation between the center conductor and the ground determines the characteristic impedance of the transmission line. A coplanar waveguide arrangement is thus created between the ground node/plane 740 and the photodetector 724 and also between the output paths 730A, 730B at the ground node/plane 740.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A transimpedance amplifier and photodiode comprising:
   a ground plane;
   a photodiode, on a substrate, configured to receive an optical signal and generate an electrical current representing the optical signal, the photodiode having a cathode terminal and an anode terminal, the cathode terminal receiving a bias voltage; and
   a capacitor having a first capacitor terminal and a second capacitor terminal, the first capacitor terminal connected to the cathode terminal and the second capacitor terminal connected to the ground plane; and
   a transimpedance amplifier on the substrate having an input and an output, the input connected to the anode terminal of the photodiode by a transmission line interconnect and the output configured to present a voltage representing the optical signal to an output path, wherein the transimpedance amplifier and the photodiode are electrically connected in a flip chip configuration without use of bond wires, and wherein the ground plane surrounds the transmission line interconnect between the photodiode and the transimpedance amplifier to create a coplanar waveguide.

2. The transimpedance amplifier and photodiode of claim 1 further including a second capacitor which is a discrete component, the second capacitor connected between the bias voltage node and the ground plane.

3. The transimpedance amplifier and photodiode of claim 1 wherein the transimpedance amplifier output path includes a conductive trace that has a first edge and second edge, and opposing the first edge and the second edge is the ground plane thereby forming a coplanar waveguide.

4. The transimpedance amplifier and photodiode of claim 3, wherein the ground plane is parallel to the first edge of the conductive trace and the ground plane is parallel to the second edge of the conductive trace.

5. The transimpedance amplifier and photodiode of claim 1 wherein the transimpedance amplifier and photodiode are configured to process a pulse amplitude signal with four amplitude levels.

6. The transimpedance amplifier and photodiode of claim 1 wherein the transimpedance amplifier includes an amplifier that has an active gain component, NPN or NMOS connected to the ground node.

7. A transimpedance amplifier and photodetector comprising:
   a photodetector, on a substrate, configured to receive an optical signal and generate an electrical current representing the optical signal, the photodetector having a cathode terminal and an anode terminal;
   a capacitor having a first capacitor terminal and a second capacitor terminal, the first capacitor terminal connected to a bias voltage, the second capacitor terminal connected to the ground node; and
   a transimpedance amplifier, on the substrate, having an input and an output, the input connected to the anode terminal of the photodetector by a transmission line interconnect and the output configured to present a voltage representing the optical signal to an output path, the transimpedance amplifier connecting to the ground node, such that the transimpedance amplifier and the photodetector are both electrically connected in a flip chip configuration, the flip chip configuration not using bond wires.

8. The transimpedance amplifier and photodetector of claim 7 further comprising a ground node that extends to each side of and between two output paths from the transimpedance amplifier to create a coplanar waveguide.

9. The transimpedance amplifier and photodetector of claim 8 wherein the ground node extends to each side of and between the photodetector cathode terminal and the anode terminal to create a coplanar waveguide.

10. The transimpedance amplifier and photodetector of claim 7 further including a second capacitor which is a discrete component, the second capacitor connected between the bias voltage and the ground plane.

11. The transimpedance amplifier and photodetector of claim 7, further comprising, the cathode terminal connected to the bias voltage node.

12. The transimpedance amplifier and photodetector of claim 7, wherein a ground connection between the semiconductor die, and a package, and a circuit board occurs through one or more solder bumps thereby shortening the length of the ground connection.

13. A method for converting an optical signal to an electrical using a photodetector and transimpedance amplifier, the method comprising:
receiving an optical signal at a photodetector;
converting the optical signal to an electrical signal with the photodetector, the photodetector located on a semiconductor die and having a cathode terminal and an anode terminal such that the cathode terminal receives a bias voltage;
presenting the electrical signal to a transimpedance amplifier located on the semiconductor die, the transimpedance amplifier having an input and an output, the input connected to the anode terminal of the photodetector and the output presenting a voltage representing the optical signal to an output path, the transimpedance amplifier and the photodetector are both electrically connected in a flip chip configuration;
creating a co-planar wave guide with a portion of a ground node that extends between and on both sides of the output path of the transimpedance amplifier.

14. The method of claim 13 further comprising a capacitor configured to provide the return path at high frequencies while maintaining DC voltage from the transimpedance amplifier, the capacitor on the semiconductor die and the capacitor having a first capacitor terminal that is connected to the bias voltage node and a second capacitor terminal connected to the ground node.

15. The method of claim 13 further comprising electrically connecting the photodetector and transimpedance amplifier to a package through one or more solder balls associated with the flip chip configuration.

16. The system of claim 15 wherein the method is passive, using only image data captured at a location of the image capture device without a remote optic signal transmitter.

17. The method of claim 13 further comprising extending the ground node to each side of and between the photodetector cathode terminal and the anode terminal to create a coplanar waveguide.

18. The method of claim 13 wherein the optic signal is a pulse amplitude modulated signal with four amplitude levels.

\* \* \* \* \*